United States Patent
Chien

(10) Patent No.: US 9,763,367 B2
(45) Date of Patent: Sep. 12, 2017

(54) CABINET HAVING AN ENVIRONMENT MONITORING FUNCTION

(71) Applicant: Cyber Power Systems Inc., Taipei (TW)

(72) Inventor: Hung-Chun Chien, Taipei (TW)

(73) Assignee: Cyber Power Systems Inc., Taipei (TW)

( * ) Notice: Subject to any disclaimer, the term of this patent is extended or adjusted under 35 U.S.C. 154(b) by 0 days.

(21) Appl. No.: 15/216,894

(22) Filed: Jul. 22, 2016

(65) Prior Publication Data

US 2016/0330860 A1    Nov. 10, 2016

Related U.S. Application Data

(63) Continuation-in-part of application No. 14/331,619, filed on Jul. 15, 2014.

(51) Int. Cl.
*H05K 7/20* (2006.01)
*H05K 7/14* (2006.01)

(52) U.S. Cl.
CPC ....... *H05K 7/20836* (2013.01); *H05K 7/1498* (2013.01); *H05K 7/20736* (2013.01)

(58) Field of Classification Search
CPC ............ H05K 7/1498; H05K 7/20736; H05K 7/20836
USPC ...................... 312/223.1, 223.2, 223.6, 236
See application file for complete search history.

(56) References Cited

U.S. PATENT DOCUMENTS

| 4,825,247 | A | 4/1989 | Kemi | |
|---|---|---|---|---|
| 5,168,171 | A | 12/1992 | Tracewell | |
| 5,199,888 | A * | 4/1993 | Condra | G06F 1/1616 |
| | | | | 312/292 |
| 6,927,336 | B2 * | 8/2005 | Huang | H04M 19/00 |
| | | | | 174/50 |
| 7,463,950 | B1 | 12/2008 | Brey | |
| 7,561,412 | B2 | 7/2009 | Brandt | |
| 8,513,522 | B2 * | 8/2013 | Liang | H05K 5/0239 |
| | | | | 174/135 |
| 8,538,732 | B2 | 9/2013 | Keyes | |
| 8,539,783 | B1 | 9/2013 | Bunch | |
| 8,854,822 | B2 * | 10/2014 | Hazzard | H05K 7/1498 |
| | | | | 312/223.2 |
| 2008/0079436 | A1 * | 4/2008 | Gollhardt | H02B 13/025 |
| | | | | 324/457 |

(Continued)

*Primary Examiner* — Daniel J Troy
*Assistant Examiner* — Hiwot Tefera
(74) *Attorney, Agent, or Firm* — Alan D. Kamrath; Kamrath IP Lawfirm, P.A.

(57) ABSTRACT

A cabinet includes a cabinet body, a monitoring system main unit and several connection interfaces. The cabinet body includes an accommodation chamber surrounded by an inside wall for accommodating electronic machines. The monitoring system main unit is mounted inside the cabinet body. The monitoring system main unit has signal lines arranged within the accommodation chamber. The connection interfaces are respectively and electrically connected to the signal lines and disposed within the accommodation chamber for the installation of different sensors. The monitoring system main unit includes a storage unit, a display unit, connection ports, a network interface and a control unit, so the monitoring system main unit is capable of displaying the data of the sensors on the display unit or a remote computer.

20 Claims, 13 Drawing Sheets

(56) References Cited

U.S. PATENT DOCUMENTS

| | | | |
|---|---|---|---|
| 2008/0081516 A1 | 4/2008 | Brandt | |
| 2009/0046415 A1* | 2/2009 | Rasmussen | H02J 9/06 |
| | | | 361/644 |
| 2010/0264782 A1 | 10/2010 | Betto | |
| 2013/0163186 A1* | 6/2013 | Mizusawa | H05K 7/14 |
| | | | 361/679.41 |
| 2014/0029198 A1* | 1/2014 | Lozon | G06F 1/16 |
| | | | 361/679.57 |
| 2014/0292167 A1* | 10/2014 | Sojka | H05K 7/1498 |
| | | | 312/234 |

* cited by examiner

CABINET HAVING AN ENVIRONMENT MONITORING FUNCTION

CROSS-REFERENCE TO RELATED APPLICATIONS

This application is a continuation-in-part of U.S. Non-Provisional application Ser. No. 14/331,619 filed Jul. 15, 2014 entitled CABINET HAVING AN ENVIRONMENT MONITORING FUNCTION, now abandoned. The entire contents of which are incorporated herein by reference for all purposes.

BACKGROUND OF THE INVENTION

1. Field of the Invention

The present invention relates to cabinets and, more particularly, to a cabinet having an environment monitoring function that has a monitoring system main unit mounted in the cabinet body thereof and a plurality of connection interfaces respectively and electrically connected to respective signal lines of the monitoring system main unit and fixedly disposed at different locations inside the cabinet body for the installation of different sensors for monitoring temperature, humidity, smoke, airflow, air pressure, contact closure and/or access control.

2. Description of Related Art

With the continuous improvement of socio-economic, national income has been continuously increased. In consequence, small and medium-sized enterprises as well as large-sized companies are more likely to be active. Further, company staffs need to use telecommunication equipment for operating electronic machines such as telephones, network systems and/or servers for industrial computers. Further, enterprises and companies normally will gather various electronic machines like servers, modems, switching systems, routers and/or other IT (information technology) equipment and machines in a cabinet. However, in order to keep normal and safe functioning of all kinds of electronic machines, including servers, modems, switching systems, routers and/or other IT (information technology) equipment and machines in an electronic machine cabinet, it is necessary to monitor the temperature, humidity, smoke, airflow, air pressure, contact closure, access control, and other fire protection safety conditions (such as flood or fire) so that any abnormality can be solved immediately when it is found.

In order to monitor various conditions in and around an electronic machine cabinet, the user may install monitors and sensors at different locations around the electronic machine cabinet. However, according to conventional methods, this monitoring must keep running round the clock under the control of a person, consuming much labor. This monitoring method cannot eliminate human error. When an unexpected condition occurs and is not found due to human error, the problem cannot be solved immediately after its occurrence. Some electronic machine cabinet providers may install different sensors in the electronic machine cabinets for monitoring various conditions. However, prior to mounting sensors inside an electronic machine cabinet, wiring is necessary. When a large number of sensors are to be installed in an electronic machine cabinet, the wiring will be complicated, very time consuming and labor intensive. Further, it is not easy to control sensor locations, to manage installed sensors, or keep installed sensors in accurate alignment with respective electronic machines in the electronic machine cabinet for monitoring temperature, humidity, smoke, airflow, air pressure, contact closure and other conditions accurately.

SUMMARY OF THE INVENTION

The present invention has been accomplished under the circumstances in view. It is therefore the main object of the present invention to provide a cabinet including a cabinet body, a monitoring system main unit and several connection interfaces. The cabinet body includes an accommodation chamber surrounded by an inside wall thereof for accommodating electronic machines. The monitoring system main unit is mounted in the accommodation chamber inside the cabinet body. The monitoring system main unit has signal lines arranged along the inside wall. The connection interfaces are respectively and electrically connected to the signal lines and disposed at different elevations in the accommodation chamber for the installation of different sensors. The monitoring system main unit includes a storage unit, a display unit, connection ports, a network interface and a control unit. The storage unit is for storing signal data of the sensors. The display unit is for display the signal data of the sensors. The connection ports are for respectively connecting to the sensors. The network interface is for connecting to a remote computer. The control unit is electrically and respectively connected to the storage unit, the display unit, the connection ports, and the network interface. The signal data of the sensors are transmitted to the control unit via the signal lines and the connection ports. The control unit stores the signal data of the sensors in the storage unit and displays the signal data of the sensors in the display unit. After establishment of the cabinet body, the arrangement of the signal lines of the monitoring system main unit is done, and no further wiring will be necessary.

Preferably, the signal lines are arranged along a horizontal top surface and vertical lateral surfaces of the inside wall of the cabinet body and exposed to the accommodation chamber. Further, the signal lines can be affixed to the horizontal top surface and vertical lateral surfaces of the inside wall of the cabinet body using an adhesive, wire pressing strips, cable holders and/or cable clips.

Further, extension lead wires can be used, respectively and electrically extended from the connection interfaces for electrically connecting different sensors to the connection interfaces, enabling the sensors to be disposed at locations relatively closer to respective electronic machines in the accommodation chamber inside the cabinet body and at respective optimal angles to enhance the sensing accuracy in monitoring the temperature, humidity, smoke, airflow, air pressure, contact closure and/or access control in and around the cabinet body.

After establishment of the cabinet body, the arrangement of the signal lines of the monitoring system main unit is done, and no further wiring will be necessary. Moreover, by installing the sensor within the accommodation chamber, the temperature at any location within the cabinet body can be determined, and the monitoring system main unit will show all of the detecting data within the cabinet body on the display unit or transmit the detecting data to a remote computer.

DETAILED DESCRIPTION OF THE PREFERRED EMBODIMENTS

Figure 1:
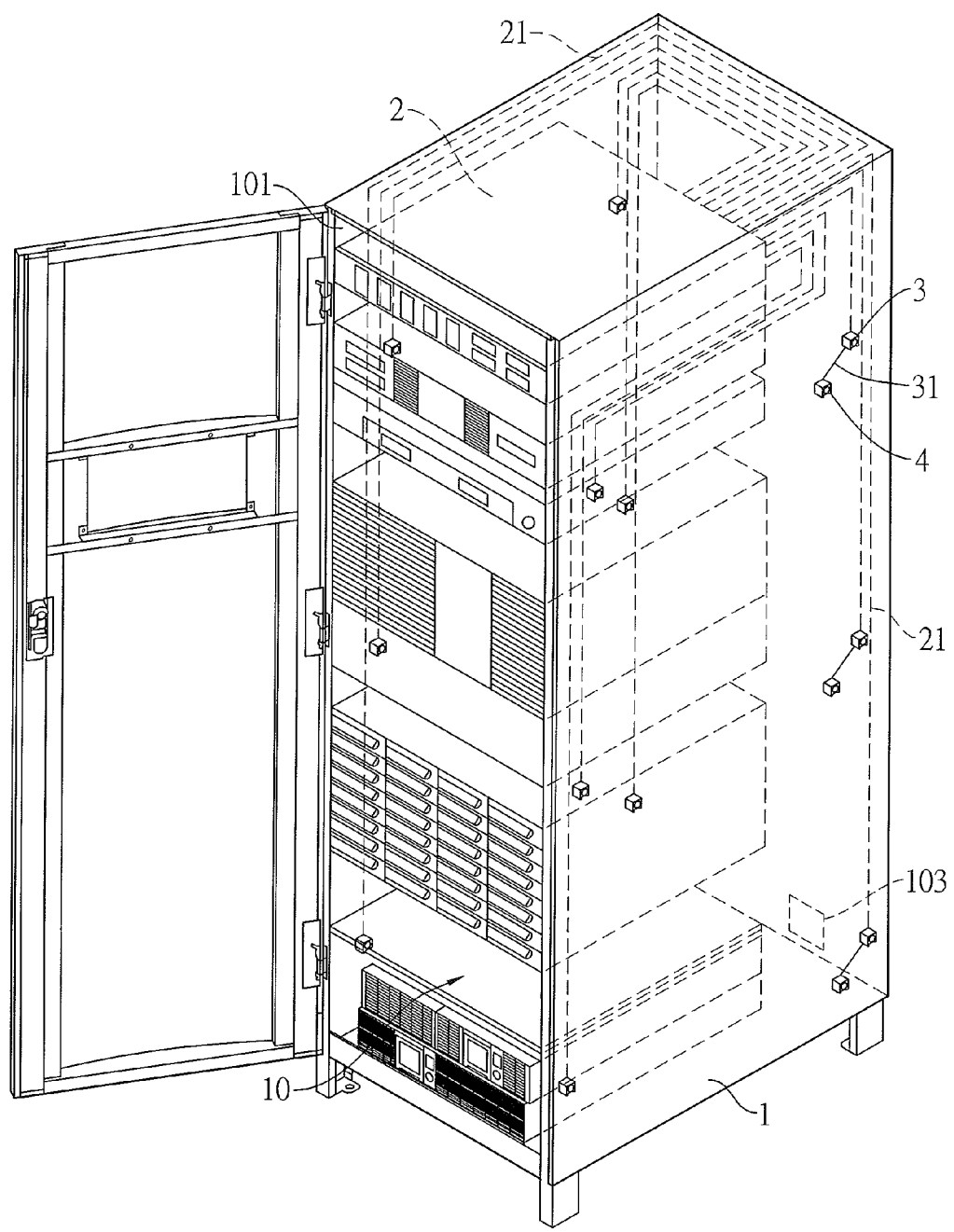
FIG. 1 is a perspective view of a cabinet in accordance with the present invention.
Figure 2:
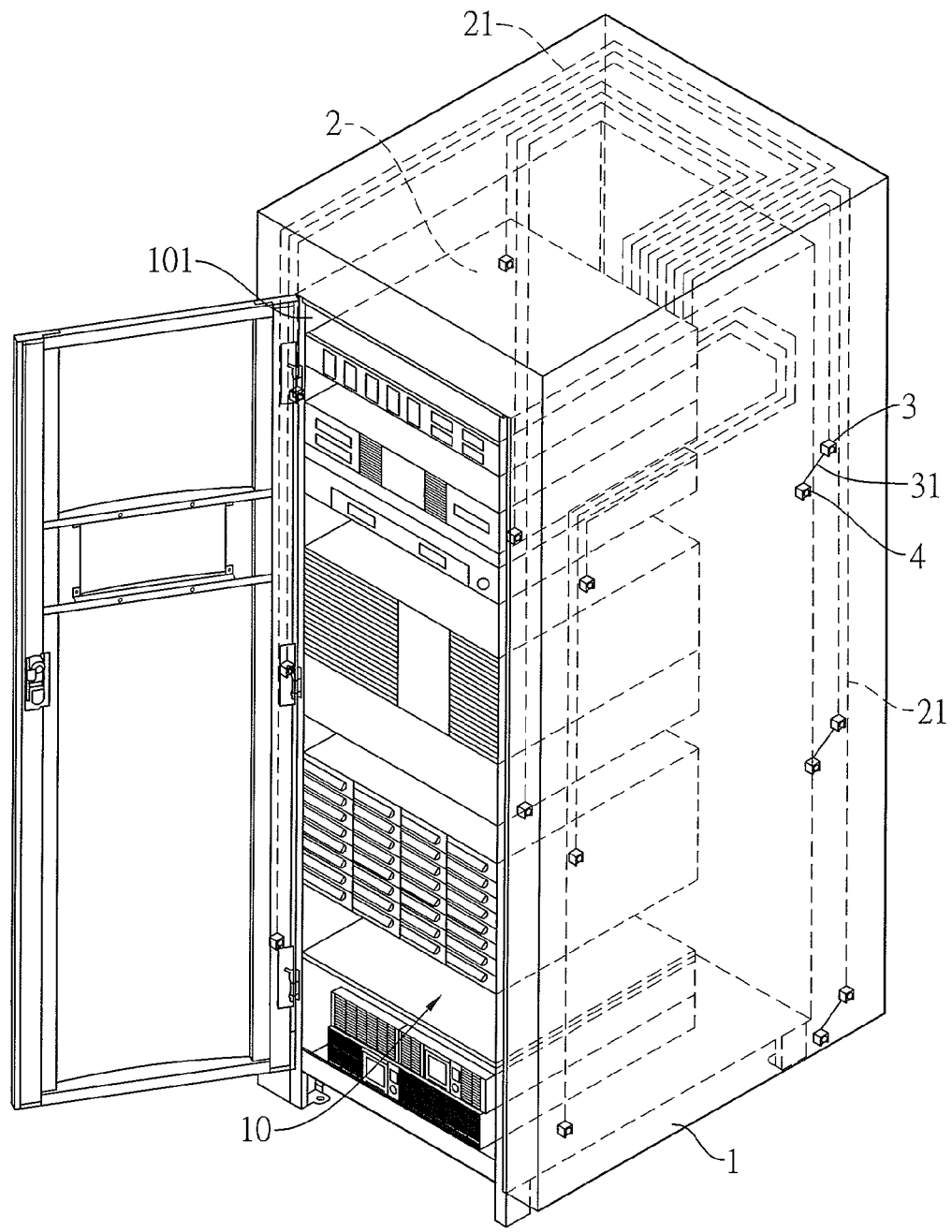
FIG. 2 is another perspective view of the cabinet in accordance with the present invention.
Figure 3:
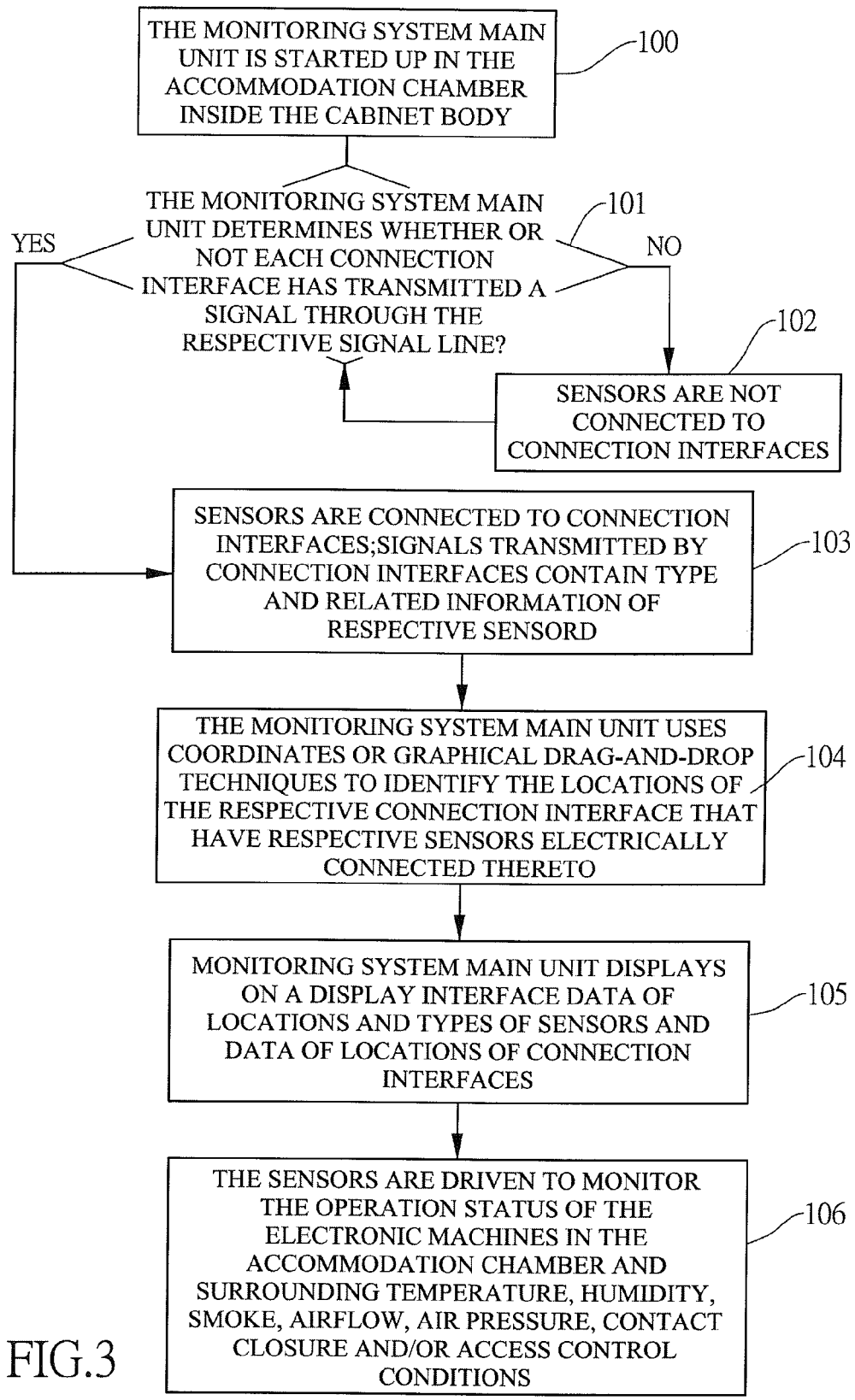
FIG. 3 is an operational flow chart of the monitoring system main unit of the cabinet in accordance with the present invention.
Figure 4:
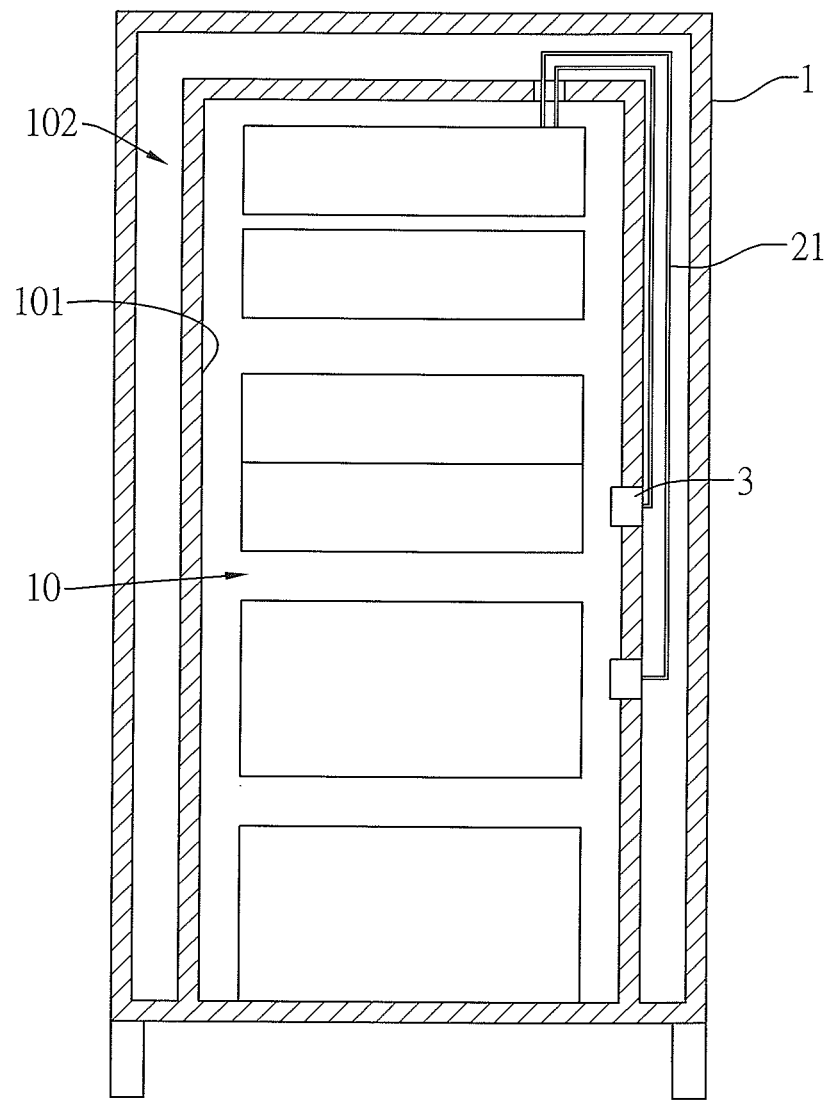
FIG. 4 is a sectional rear side view of the cabinet in accordance with the present invention.

Referring to FIGS. 1-4, a cabinet having an environment monitoring function in accordance with the present invention is shown. The cabinet comprises a cabinet body 1, a monitoring system main unit 2, and a plurality of connection interfaces 3.

The cabinet body 1 defines therein an accommodation chamber 10 adapted for accommodating various electronic machines such as servers, modems, switching systems, routers and/or other IT (information technology) equipment and machines.

The monitoring system main unit 2 has electrically connected thereto a plurality of signal lines 21. The connection interfaces 3 are respectively connected to the signal lines 21 remote from the monitoring system main unit 2. Further, the connection interfaces 3 can be plug type or socket type electric connectors.

During installation of the present invention, the monitoring system main unit 2 is mounted in the accommodation chamber 10 inside the cabinet body 1 to arrange the signal lines 21 along the inside wall 101 of the cabinet body 1 and to fixedly mount the connection interfaces 3 in the peripheral wall of the cabinet body 1 at different elevations to face toward the accommodation chamber 10 for the mounting of different sensors 4.

Further, the signal lines 21 are arranged along the horizontal top surface and vertical lateral surfaces of the inside wall 101 of the cabinet body 1 and affixed thereto using an adhesive, wire pressing strips, cable holders, cable clips. After installation, the connection interfaces 3 are fixedly arranged on the inside wall 101 of the cabinet body 1 at different elevations within the accommodation chamber 10, and sensors 4 are respectively connected to the connection interfaces 3 to face toward different electronic machines, such as servers, modems, switching systems, routers and/or other IT (information technology) equipment and machines that are accommodated in the accommodation chamber 10 at different elevations. These sensors 4 are adapted for monitoring temperature, humidity, smoke, airflow, air pressure, contact closure and/or access control. Alternatively, the sensors 4 can be arranged to face toward the outside of the cabinet body 1 for monitoring the surrounding temperature, humidity, smoke, airflow, air pressure, contact closure and/or access control outside the cabinet body 1. Thus, in case an unexpected disaster (flooding, fire or earthquake) or severe weather event occurs, the maintenance engineer in charge can then take all the necessary steps to maintain normal functioning of all the electronic machines in the cabinet body 1.

Further, the cabinet body 1 can be configured to provide a hidden space 102 between the inside wall 101 and the cabinet body 1 and around the accommodation chamber 10 for receiving the signal lines 21, enabling the connection interfaces 3 at the respective distal ends of the signal lines 21 to be disposed outside the hidden space 102 to hold the respective sensors 4 at different elevations in respective selected angles for monitoring the temperature, humidity, smoke, airflow, air pressure, contact closure and/or access control in the cabinet body 1 and the surrounding temperature, humidity, smoke, airflow, air pressure, contact closure and/or access control outside the cabinet body 1. For example, the sensors 4 can be configured to provide an alarm signal if the ambient temperature is beyond a predetermined normal temperature range (for example, 20°~25° C.) due to accumulation of waste heat discharged by the electronic machines in the cabinet, the ambient humidity is beyond a predetermined normal humidity range (for example, 44~55%) due to a significant weather change or the occurrence of an unexpected disaster (flooding, fire or earthquake), a severe weather event (cold snap or typhoon induced airflow or air pressure instability) occurs, smoke occurs (due to a fire accident or electronic machine failure), or the contact closure of an access door is opened (due to an intrusion), assuring normal functioning of the electronic machines in the cabinet body 1. Thus, after establishment of the cabinet body 1, the arrangement of the signal lines 21 of the monitoring system main unit 2 is done and no further wiring will be necessary. After installation of electronic machines in the accommodation chamber 10 inside the cabinet body 1, the connection interfaces 3 and the respective sensors 4 are kept in alignment with the respective installed electronic machines.

Through the sensors 4 and the signal lines 21, the monitoring system main unit 2 starts up a monitoring operation subject to the following steps:

(100) The monitoring system main unit 2 is started up in the accommodation chamber 10 inside the cabinet body 1.

(101) The monitoring system main unit 2 determines whether or not each connection interface 3 has transmitted a signal through the respective signal line 21, and then proceeds to step (102) if negative, or step (103) if positive.

(102) The connection interfaces 3 are not electrically connected with respective sensors 4, and then return to step (101).

(103) The connection interfaces 3 are electrically connected with respective sensors 4, and the signals transmitted by the respective connection interfaces 3 contain the type and related information of the respective sensors 4.

(104) The monitoring system main unit 2 uses coordinates or graphical drag-and-drop techniques to identify the locations of the respective connection interfaces 3 that have respective sensors 4 electrically connected thereto.

(105) The monitoring system main unit 2 displays the data of the locations and types of the sensors and the data of the locations of the connection interfaces 3 on a display interface thereof.

(106) The sensors 4 are driven to monitor the operation status of the electronic machines in the accommodation chamber 10 inside the cabinet body 1 and surrounding temperature, humidity, smoke, airflow, air pressure, contact closure and/or access control conditions.

Further, the monitoring system main unit 2 can be linked to a remote host (computer, monitor or surveillance system) by a cable or wireless technology, enabling the remote host to perform an auto monitoring and management operation through the cabinet body 1 and its internal monitoring system main unit 2, reducing human error and the consumption of time and labor.

Further, the cabinet body 1 has at least one drain hole 103 cut through the inside wall 101 near a bottom side thereof for discharge of water. Further, one connection interface 3 is disposed adjacent to each drain hole 103. The sensor 4 installed in the connection interface 3 adjacent the drain hole 103 is capable of detecting moisture and humidity, and will produce an alarm signal if flooding or water leakage occurs, enabling the person in charge to remove the cabinet to a safe place or to take the all the necessary steps.

Further, extension lead wires 31 can be used to electrically connect respective sensors 4 to the connection interfaces 3, enabling the sensors 4 to be disposed at locations relatively closer to respective electronic machines in the accommodation chamber 10 inside the cabinet body 1 and at respective optimal angles to enhance the sensing accuracy in monitoring the temperature, humidity, smoke, airflow, air pressure, contact closure and/or access control in and around the cabinet body 1.

As described above, the invention provides a cabinet having an environment monitoring function that comprises a cabinet body 1 that defines therein an accommodation chamber 10 adapted for accommodating various electronic machines such as servers, modems, switching systems, routers and/or other IT (information technology) equipment and machines, a monitoring system main unit 2 having electrically connected thereto a plurality of signal lines 21 that are arranged along a horizontal top surface and vertical lateral surfaces of an inside wall 101 of the cabinet body 1 and affixed thereto using an adhesive, wire pressing strips, cable holders, cable clips, a plurality of connection interfaces 3 respectively connected to the signal lines 21 remote from the monitoring system main unit 2 and fixedly arranged on the inside wall 101 of the cabinet body 1 at different elevations within the accommodation chamber 10, and different sensors 4 respectively connected to the connection interfaces 3 to face toward different electronic machines, such as servers, modems, switching systems, routers and/or other IT (information technology) equipment and machines that are accommodated in the accommodation chamber 10 at different elevations for monitoring temperature, humidity, smoke, airflow, air pressure, contact closure and/or access control. After establishment of the cabinet body 1, the arrangement of the signal lines 21 of the monitoring system main unit 2 is done, and no further wiring will be necessary. After installation of electronic machines in the accommodation chamber 10 inside the cabinet body 1, the connection interfaces 3 and the respective sensors 4 are kept in alignment with the respective installed electronic machines for monitoring the temperature, humidity, smoke, airflow, air pressure, contact closure and/or access control in and around the cabinet body 1. Further, extension lead wires 31 can be used to electrically connect respective sensors 4 to the connection interfaces 3, enabling the sensors 4 to be disposed at locations relatively closer to respective electronic machines in the accommodation chamber 10 inside the cabinet body 1 and at respective optimal angles to enhance the sensing accuracy in monitoring the temperature, humidity, smoke, airflow, air pressure, contact closure and/or access control in and around the cabinet body 1.

Figure 5A:
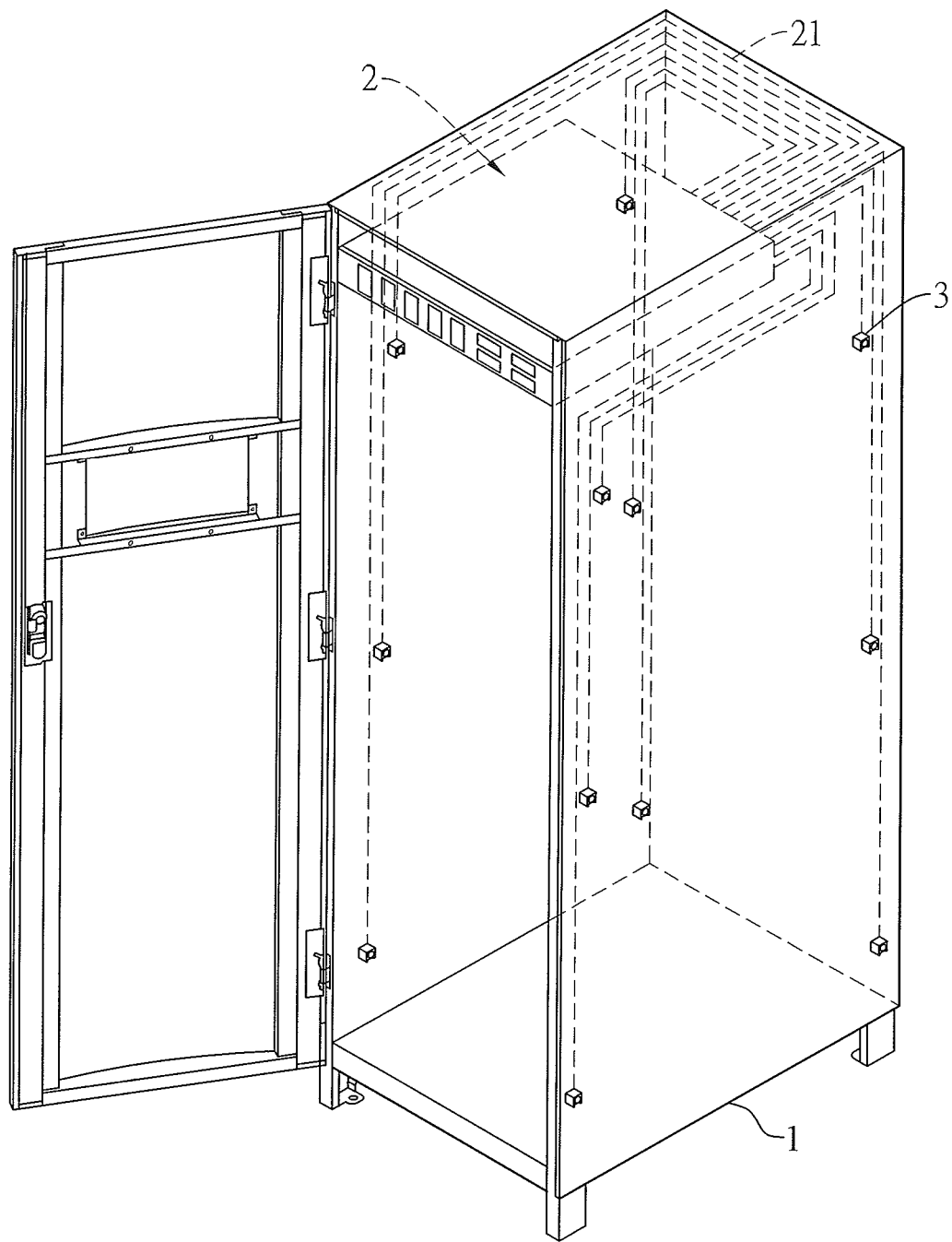
FIG. 5A and FIG. 5B are perspective views of the cabinet in the present invention.
Figure 5B:
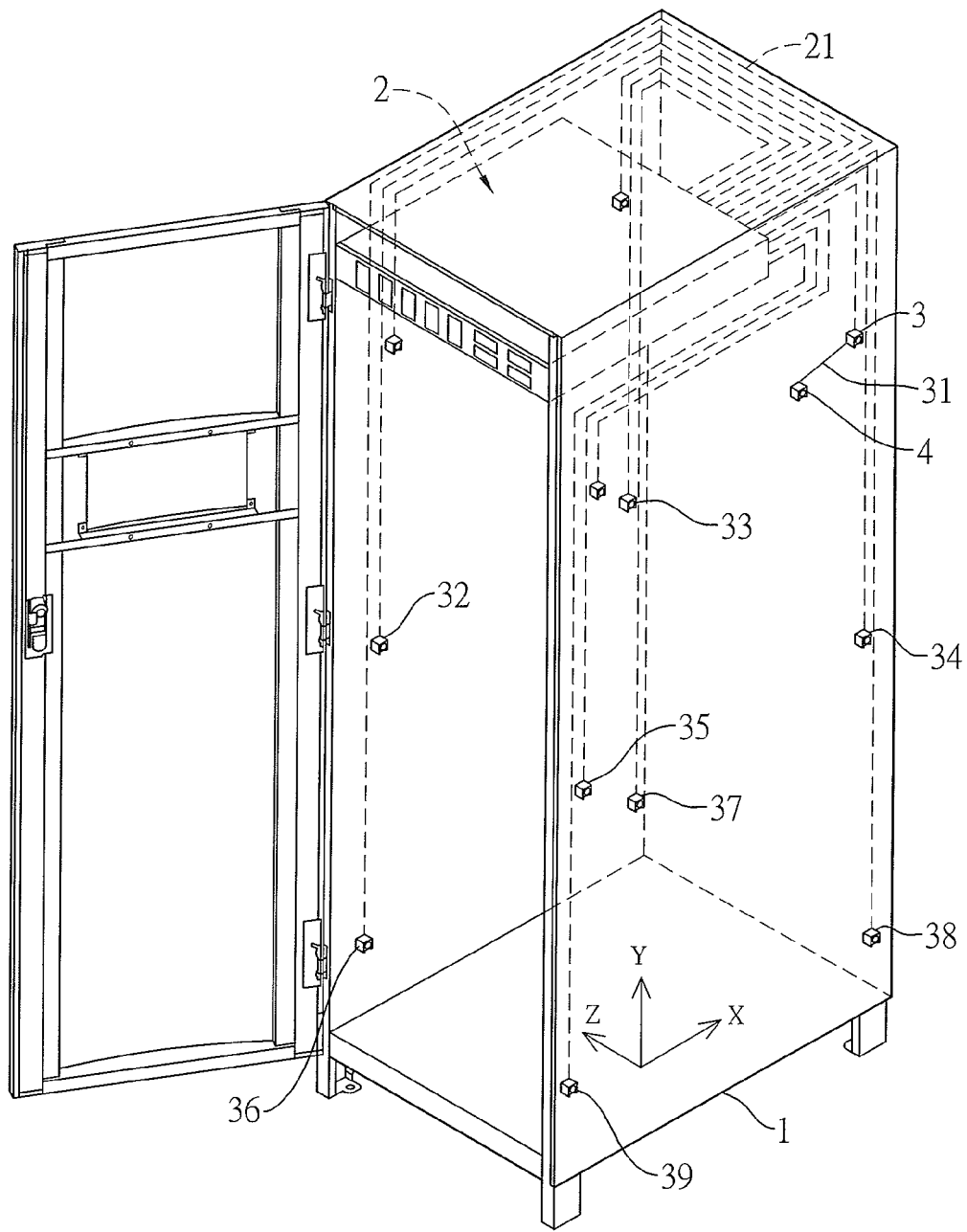

With reference to FIG. 5A and FIG. 5B, the locations of the connection interfaces 3 are fixed within the accommodation chamber 10. Therefore, the geographic information of the locations of the connection interfaces 3 will be memorized in the monitoring system main unit 2. As long as the sensor 4 is installed in one of the connection interfaces 3, the monitoring system main unit 2 will recognize the sensing signal is transmitted from one of the sensors 4. Also, since the connection interfaces 3 are evenly disposed within the accommodation chamber 10, the temperature or the humidity of the accommodation chamber 10 at any corner may be detected by the sensors 4.

Since the connection interfaces 3 are fixed within the accommodation chamber 10, the temperature at any point within the accommodation chamber 10 may be easy to be calculated. For example, with reference to FIG. 6, sensors 41-48 represent eight of the sensors 4 installed in the connection interfaces 32-39 shown in FIG. 5A or FIG. 5B. Every four sensors (41-44 or 45-48) are respectively located at the same elevation. The temperature at any point may be calculated in accordance with an equation:

$$T = \left[\left(T_{48}\frac{l_1-x'}{l_1} + T_{47}\frac{x'}{l_1}\right)\frac{l_2-y'}{l_2} + \left(T_{44}\frac{l_1-x'}{l_1} + T_{43}\frac{x'}{l_2}\right)\frac{y'}{l_2}\right]\frac{l_3-z'}{l_3} + \left[\left(T_{45}\frac{l_1-x'}{l_1} + T_{46}\frac{x'}{l_1}\right)\frac{l_2-y'}{l_2} + \left(T_{41}\frac{l_3-x'}{l_3} + T_{42}\frac{x'}{l_3}\right)\frac{y'}{l_3}\right]\frac{l_3-z'}{l_3}$$

Where $T_{41}$ to $T_{48}$ are the temperatures detected by the sensors 41-48, 11 is a distance between the sensors 47 and 48, 12 is the distance between the sensors 44 and 48, 13 is the distance between the sensors 45 and 48, and x', y', and z' are coordinates for a measuring point. Accordingly, by the aforementioned equation, the temperature at any measuring point within the accommodation chamber can be determined. In addition, the equation may be stored within the monitoring system main unit 2.

Figure 7:
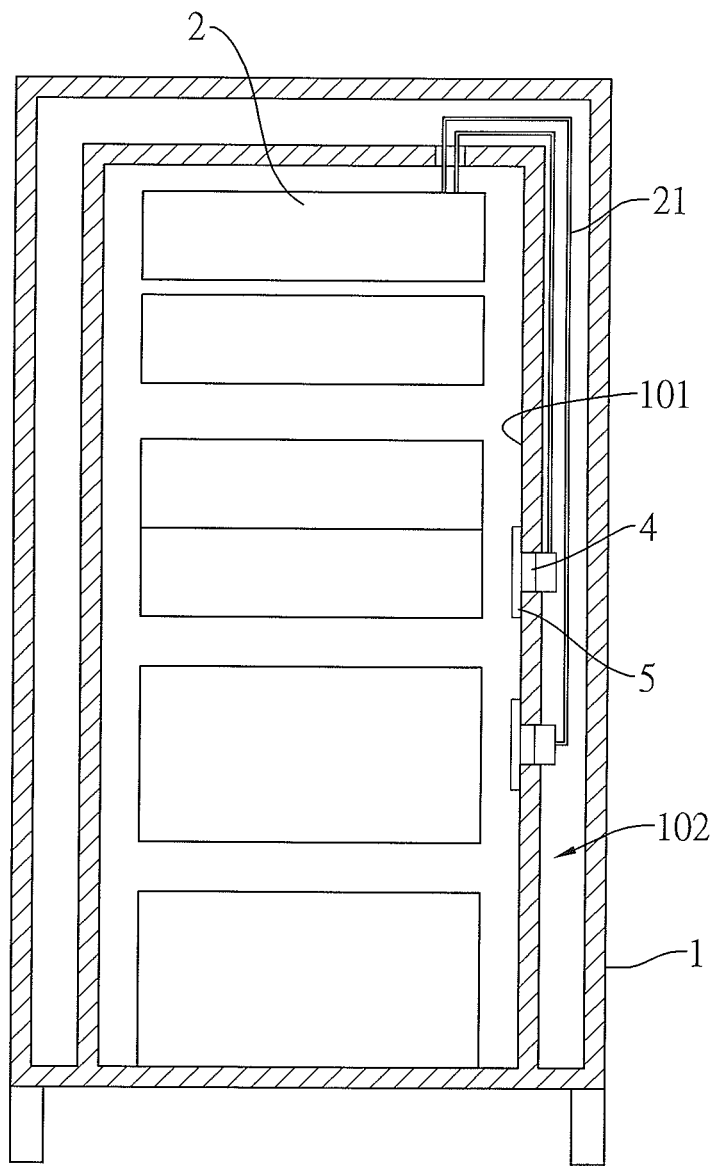
FIG. 7 is a sectional view of the cabinet in a different embodiment of the present invention.

With reference to FIG. 7, in one embodiment of the present invention, the connection interfaces 3 may be embedded within the inside wall 101 without protruding from a front side of the inside wall 101. The connection interfaces 3 are covered by a plurality of shields 5 respectively to prevent the connection interfaces 3 being hit during the installation of the electronic machines. The sensors 4 in the present embodiment are connected to the connection interfaces 3 respectively. The connection interfaces 3 protrude from a rear side of the inside wall 101 and are connected to the signal lines 21, so the sensors 4 are connected to the monitoring system main unit 2 by the connection interface 3 and the signal lines 21. The rear side is close to the accommodation chamber 10. Alternatively, with reference to FIG. 8, in a different embodiment, the cabinet body 1 may not include the inside wall 101. The signal lines 21 are covered and protected by a plurality of metal pipes 107. The metal pipes 107 surround the accommodation chamber 10. The signal lines 21 are arranged within the metal pipes 107. Therefore, the signal lines 21 may be organized and protected by the metal pipes 107. The sensors 4 in FIG. 8 are embedded within the cabinet body 1.

Figure 8:
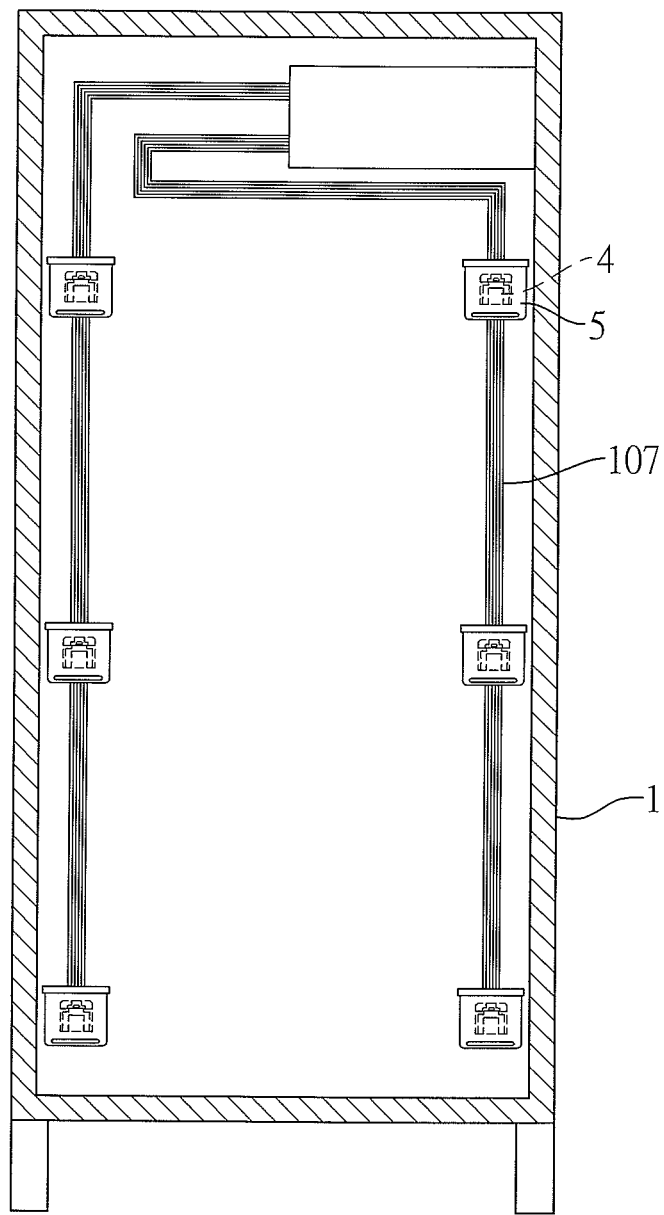
FIG. 8 is a sectional view of the cabinet in a different embodiment of the present invention.
Figure 9A:
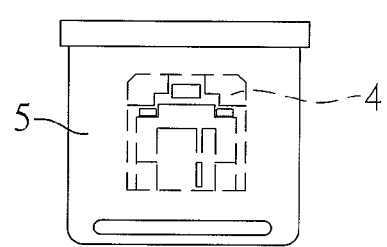
FIG. 9A is a view of a sensor and a shield in the present invention.
Figure 9B:
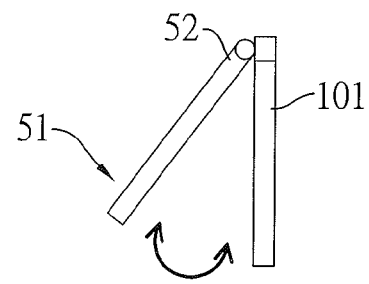
FIG. 9B is a sectional view of the sensor and the shield in the present invention.
Figure 10:
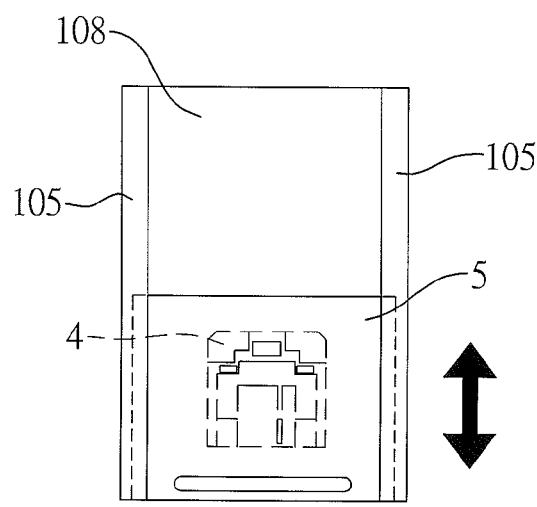
FIG. 10 and FIG. 11 are views of the sensor and the shield in the present invention.
Figure 11:
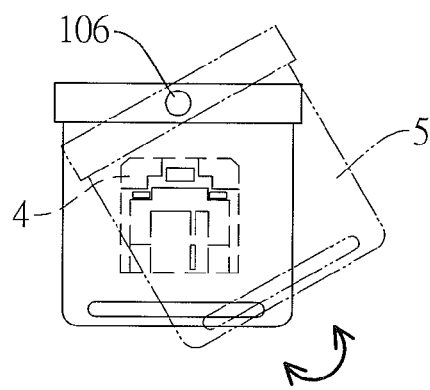

Specifically, the shields 5 shown in FIG. 7 and FIG. 8 used for covering the connection interfaces 3 may include some different opening manners to expose the connection interfaces 3. For example, as one embodiment shown in FIG. 9A and FIG. 9B, a first side 51 at each of the shields 5 is pivotally connected to an internal surface 108, so the shield 5 may be lifted up from a second side 52 of each of the shields 5 to expose the connection interfaces 3. The internal surface 108 may be a surface of the inside wall 101 or a surface of the cabinet body 1, and it is not limited herein. The second side 52 is opposite to the first side 51. In a different embodiment, as shown in FIG. 10, the shield 5 is installed on the inside wall 101, and the inside wall includes long recesses 105. A left side and a right side of the shield 5 are respectively located within the long recesses 105 on the inside wall 101. Therefore, the shield 5 may vertically move up or down to expose the connection interfaces 3. Moreover, in another different embodiment, as shown in FIG. 11, the shield 5 is fixed on the inside wall 101 by a pivot 106, so the shield 5 may be rotated in accordance with the pivot 106 to expose the connection interfaces 3.

Figure 12:
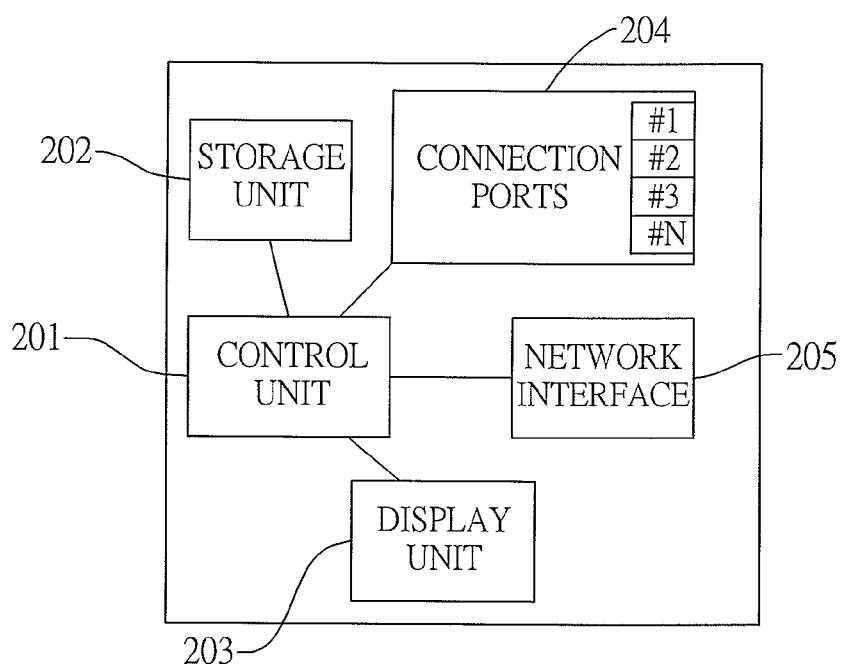
FIG. 12 is a block diagram of a monitoring system main unit in the present invention.

With reference to FIG. 12, in order to manage the signals generated from the sensors 4, the monitoring system main unit 2 includes a control unit 201, a storage unit 202, a display unit 203, a plurality of connection ports 204, and a network interface 205. The control unit 201 is electrically and respectively connected to the storage unit 202, the display unit 203, the connection ports 204, and the network interface 205. The connection ports 204 are configured to connect to the sensors 4 respectively. The signals of the sensors 4 are transmitted to the control unit 201 via the signal lines 21 and the connection ports 204. The control unit 201 will store the signals of the sensors 4 in the storage unit 202 and also display the data for the signals of the sensors 4 on the display unit 203.

Figure 6:
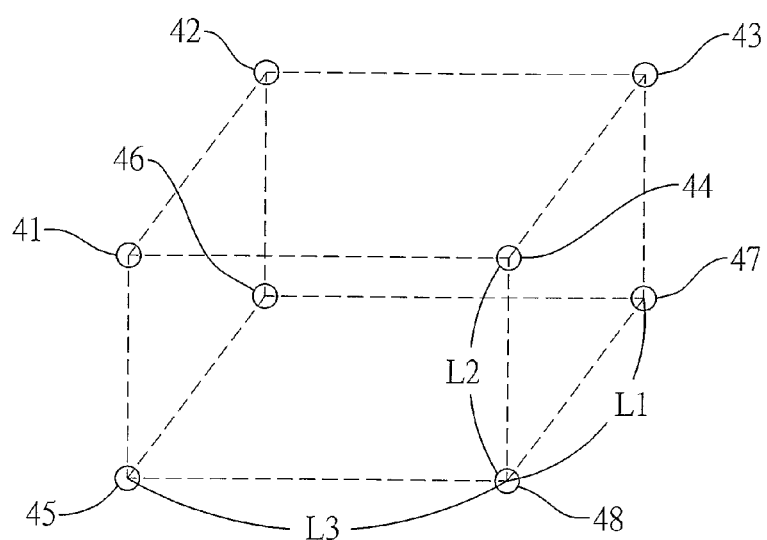
FIG. 6 is a view showing how to calculate the temperature at any point in accordance with the location of the sensors in the present invention.
Figure 13:
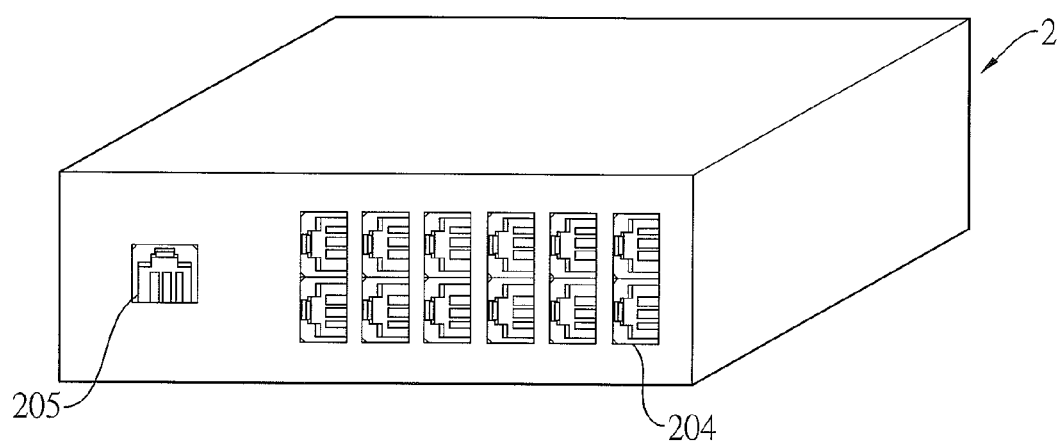
FIG. 13 is a perspective view of the monitoring system main unit showing the connection ports and the network interface in the present invention.
Figure 14:
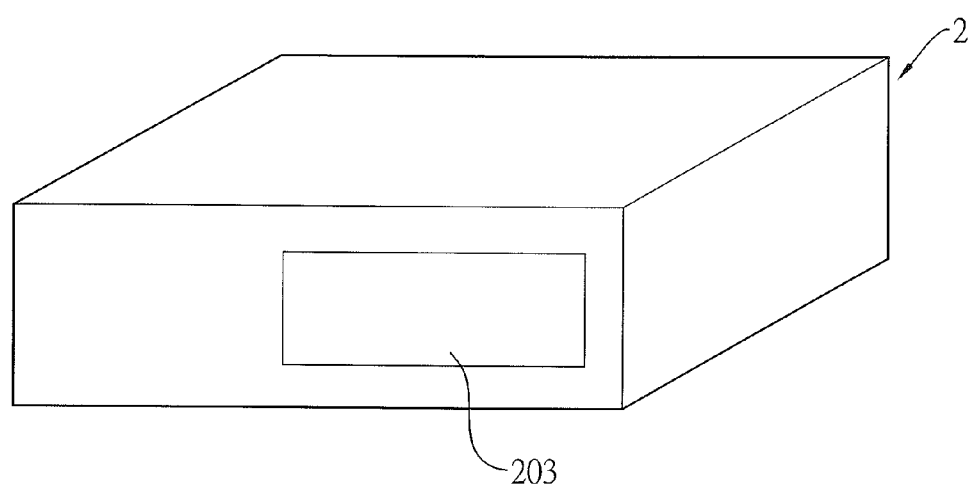
FIG. 14 is another perspective view of the monitoring system main unit having the display unit in the present invention.

Moreover, the control unit 201 may further transmit the data for the signals of the sensors 4 to a remote computer via the network interface 205. The network interface 205 may be a wireless network adapter or a RJ45 network port, and it is not limited herein. Therefore, the data for the signals of the sensors 4 may be transmitted from the monitoring system main unit 2 to the remote computer by a wire or a wireless transmission manner. Accordingly, the data of the sensors 4 may be shown not only on the display unit 203 of the monitoring system main unit 2 as shown in FIG. 13, but also on a web page of the remote computer. The data of the sensors 4, for example, may be locations, types and signal data of the sensors 4. Therefore, the user may monitor the condition of the cabinet body 1 in front of the cabinet body 1 or remotely monitor the condition of the cabinet body 1 on the remote computer. In addition, the signal data shown on the display unit 203 or the web page of the remote computer may be the temperature determined at any one of the measuring points within the accommodation chamber 10 as shown in FIG. 6.

Although particular embodiments of the invention have been described in detail for purposes of illustration, various modifications and enhancements may be made without departing from the spirit and scope of the invention. Accordingly, the invention is not to be limited except as by the appended claims.

What is claimed is:
1. A cabinet comprising:
a cabinet body comprising an accommodation chamber for accommodating electronic machines;
a monitoring system main unit mounted in said accommodation chamber inside said cabinet body and having a plurality of signal lines arranged within said cabinet body; and
a plurality of connection interfaces respectively and electrically connected to said plurality of signal lines and disposed within said accommodation chamber, a plurality of sensors installed in said accommodation chamber, said plurality of sensors including first, second, third, fourth, fifth, sixth, seventh, and eighth temperature sensors, wherein the first sensor to the fourth sensor are located at an upper elevation of the cabinet body and the fifth sensor to the eighth sensor are located at a lower elevation of the cabinet body vertically below the upper elevation with the first sensor to the fourth sensor vertically corresponding to the fifth sensor to the eighth sensor;
wherein said monitoring system main unit includes:
a storage unit storing signal data detected by said plurality of sensors;
a display unit displaying said signal data of said plurality of sensors;
a plurality of connection ports connecting to said plurality of connection interfaces via said signal lines;
a network interface connecting to a remote computer; and
a control unit electrically and respectively connected to said storage unit, said display unit, said plurality of connection ports, and said network interface;
wherein said signal data of said first through eighth temperature sensors are transmitted to said control unit via said plurality of signal lines and said plurality of connection ports.

2. The cabinet as claimed in claim 1, wherein a temperature of a point to be measured inside the accommodation chamber of the cabinet body is calculated by:

$$\frac{\left[\left(T_{48}\frac{l_1-x'}{l_1}+T_{47}\frac{x'}{l_1}\right)\frac{l_2-y'}{l_2}+\left(T_{44}\frac{l_1-x'}{l_1}+T_{43}\frac{x'}{l_1}\right)\frac{y'}{l_2}\right]\frac{l_3-z'}{l_3}+\left[\left(T_{45}\frac{l_1-x'}{l_1}+T_{46}\frac{x'}{l_1}\right)\frac{l_2-y'}{l_2}+\left(T_{41}\frac{l_3-x'}{l_3}+T_{42}\frac{x'}{l_3}\right)\frac{y'}{l_3}\right]}{\frac{l_3-z'}{l_3}}$$

wherein:
$T_{41}$ to $T_{48}$ are temperatures detected by the first sensor to the eighth sensor;
$l_1$: a distance between the seventh sensor and the eighth sensor;
$l_2$: a distance between the fourth sensor and the eighth sensor;
$l_3$: a distance between the fifth sensor and the eighth sensor; and
x', y' and z' are coordinates of the point to be measured.

3. The cabinet as claimed in claim 2, wherein said accommodation chamber is configured to accommodate servers, modems, switching systems, routers or other IT (information technology) equipment and machines used by electronic products.

4. The cabinet as claimed in claim 2, wherein said plurality of signal lines is arranged along a horizontal top surface and a plurality of vertical lateral surfaces within said cabinet body.

5. The cabinet as claimed in claim 4, wherein said plurality of signal lines is affixed along said horizontal top surface and said plurality of vertical lateral surfaces within said cabinet body using an adhesive, wire pressing strips, cable holders or cable clips.

6. The cabinet as claimed in claim 2, wherein said cabinet body further comprises an inside wall and an outside wall, wherein a hidden space is defined between the inside wall and the outside wall for receiving said plurality of signal lines, enabling said plurality of connection interfaces to be disposed outside said hidden space to hold respective temperature sensors at different elevations in respective selected angles.

7. The cabinet as claimed in claim 6, wherein said plurality of connection interfaces is embedded within said inside wall of said cabinet body.

8. The cabinet as claimed in claim 7, further including a plurality of shields respectively covering and protecting said plurality of connection interfaces.

9. The cabinet as claimed in claim 8, wherein a first side at each of said plurality of shields is pivotally connected to an internal surface of said inside wall, a second side of each of said plurality of shields is opposite to the first side, and the second side thereof is lifted up to expose one of said plurality of connection interfaces.

10. The cabinet as claimed in claim 8, wherein the inside wall includes long recesses, a left side and a right side of each of said plurality of shields are respectively located within said long recesses of said inside wall, and each of said plurality of shields is capable of moving to expose one of said plurality of connection interfaces.

11. The cabinet as claimed in claim 8, wherein each of said plurality of shields is fixed on said inside wall by a pivot, and each of plurality of said shield is capable of being rotated in accordance with said pivot to expose one of said plurality of connection interfaces.

12. The cabinet as claimed in claim 2, wherein said plurality of connection interfaces is plug type or socket type electric connectors.

13. The cabinet as claimed in claim 2, wherein said plurality of sensors is respectively installed for monitoring temperature, humidity, smoke, airflow, air pressure, contact closure or access control.

14. The cabinet as claimed in claim 2, further comprising a plurality of extension lead wires respectively and electrically extending from said plurality of connection interfaces and adapted for electrically connecting said temperature sensors to said plurality of connection interfaces.

15. The cabinet as claimed in claim 2, wherein said accommodation chamber is surrounded by a plurality of metal pipes and said plurality of signal lines is arranged within said plurality of metal pipes of said cabinet body and affixed thereto.

16. The cabinet as claimed in claim 15, wherein said plurality of connection interfaces is embedded within said cabinet body.

17. The cabinet as claimed in claim 16, further including a plurality of shields respectively covering and protecting said plurality of connection interfaces.

18. The cabinet as claimed in claim 17, wherein a first side at each of said plurality of shields is pivotally connected to an internal surface of said cabinet body, a second side of each of said plurality of shields is opposite to the first side, and the second side thereof is lifted up to expose one of said plurality of connection interfaces.

19. The cabinet as claimed in claim 17, wherein said cabinet body includes long recesses, a left side and a right side of each of said plurality of shields are respectively located within said long recesses of said cabinet body, and each of said plurality of shields is capable of moving to expose one of said plurality of connection interfaces.

20. The cabinet as claimed in claim 17, wherein each of said plurality of shields is fixed on said cabinet body by a pivot, and each of said plurality of shields is capable of being rotated in accordance with said pivot to expose one of said plurality of connection interfaces.

* * * * *